(12) United States Patent
Sharma

(10) Patent No.: US 9,590,599 B1
(45) Date of Patent: Mar. 7, 2017

(54) CLOCK DISTRIBUTION FOR FLIP-FLOP CIRCUITS

(71) Applicant: NXP B.V., Eindhoven (NL)

(72) Inventor: Vibhu Sharma, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/879,878

(22) Filed: Oct. 9, 2015

(51) Int. Cl.
*H03K 3/3562* (2006.01)
*H03K 3/037* (2006.01)

(52) U.S. Cl.
CPC ....... *H03K 3/0372* (2013.01); *H03K 3/35625* (2013.01)

(58) Field of Classification Search
CPC .......................... H03K 3/0372; H03K 3/35625
See application file for complete search history.

(56) References Cited

U.S. PATENT DOCUMENTS

| | | | | |
|---|---|---|---|---|
| 8,471,618 B2* | 6/2013 | Chien | ................... | H03K 3/012 327/203 |
| 9,425,775 B2* | 8/2016 | Jarrar | ................. | H03K 3/35625 |
| 2015/0123722 A1 | 5/2015 | Sharma et al. | | |
| 2015/0123723 A1 | 5/2015 | Sharma et al. | | |

OTHER PUBLICATIONS

V.Sharma et.al., SRAM Design for Wireless Sensor Networks, Springer ISBN 978-1-4614-4039-0 Book Description provided.
Pakola et al., Physical Synthesis for performance optimization, ASIC Conference and Exhibit, 1992., Proceedings of Fifth Annual IEEE International Abstract Only.

* cited by examiner

*Primary Examiner* — Patrick O'Neill

(57) ABSTRACT

An apparatus is disclosed that includes a clock distribution circuit configured to shift a first clock signal in the first voltage domain to a second voltage domain to produce the second clock signal. The second voltage domain extends outside of the first voltage domain. A set of flip-flops operating in the first voltage domain, each including a master latch, a slave latch, and a clock node is coupled to receive the second clock signal. Each flip-flop includes a master pass transistor configured to pass a value from an input of the flip-flop to an input of the master latch when the second clock node is set to a first value. Each flip-flop also includes a master pass transistor configured to pass the value from an output of the master latch to an input of the slave latch when the second clock node is set to a second value.

20 Claims, 6 Drawing Sheets

CLOCK DISTRIBUTION FOR FLIP-FLOP CIRCUITS

OVERVIEW

Aspects of various embodiments are directed to electronic hardware and methods for operating electronic hardware, and, more particularly, to latch circuits and methods for operating flip-flop circuits.

Modern digital circuits, whether implemented in integrated circuits (IC) or in discrete form, often utilize data latches to sample and hold values of a signal. One type of latch, referred to as a level-sensitive latch, provides an output signal having a state that depends upon the activity of the clock signal that is present at a clock input node. In particular, the logic value of the output signal of the level-sensitive latch reflects the logic value of the signal at the input node during a portion of the input clock cycle. In this phase of operation, the latch passes logic values present at its input node directly to its output node. A latch operating in this phase may be referred to as being transparent. In a second phase of operation, the level-sensitive latch maintains the output signal at a fixed logic value during the remaining portion of the input clock cycle, regardless of the logic value present at the input node. A latch operating in the second phase may be referred to as being latched.

Another type of latch, referred to as an edge-triggered latch, is configured to set and hold an output signal to a logic value present at an input node during an edge of a clock signal provided to a clock input node. One implementation of an edge-triggered latch, referred to as a flip-flop includes a combination of two level-sensitive latches. The first level-sensitive latch, i.e., the master latch, is transparent during a first phase of the input clock, while the second level-sensitive latch, i.e., the slave latch, is transparent during a second phase of the input clock. The combined behavior is such that the input data is captured and passed to the output node only when the clock signal exhibits a low-to-high logic transition. The value of the output signal is maintained until the next low-to-high transition of the clock signal. Conversely, the configuration of the master and slave latches may be altered to capture input data during a high-to-low logic transition of the clock signal.

SUMMARY

Various example embodiments are directed to flip-flop apparatuses and methods for operating flip-flops. In an example embodiment, an apparatus includes a clock distribution circuit configured to shift a first clock signal operating in the first voltage domain to a second voltage domain to produce the second clock signal. The second voltage domain includes a voltage that is extending outside of the first voltage domain. The apparatus also includes a set of flip-flops configured to operate in the first voltage domain. Each flip-flop includes a master latch, a slave latch, and a clock node coupled to receive the second clock signal. The master latch circuit including a master storage circuit configured to store a first value from a master input node and provide the stored first value on a master output node. The master latch also includes a master pass transistor configured to pass the first value from the master input node of the flip-flop to the master input node when clock node is set to a first value and prevent passing of the first value from the input of the flip-flop to the master input node when the clock node is set to a second value. The slave latch circuit includes a slave storage circuit is configured to store a second value from a slave input node and provide the stored second value on a slave output node. The slave latch circuit also includes a slave pass transistor is configured to pass the second value from the master output node to the slave input node when the clock node being is set to the second value and prevent passing of the second value from the master output node to the slave input node when the clock node is set to the first value.

In another example embodiment, a method is provided for operating flip-flops. Using a clock distribution circuit, a first clock signal operating in the first voltage domain is shifted to a second voltage domain to produce the second clock signal. The second voltage domain includes a voltage that extends beyond the first voltage domain. A set of flip-flops are operated in the first voltage domain. The second clock signal is provided to respective clock nodes of the set of flip-flops. Each of the flip-flops includes a respective master latch circuit and a respective slave circuit. For each of the set of flip-flops, a first value is passed from an input of the flip-flop to a master input node for the master latch in response to the clock node of the flip-flop being set to a first value. The first value is prevented from being passed to the master input node in response to the clock node being set to a second value. A second value is passed from a master output node of the master latch to a slave input node of the slave latch in response to the clock node being set to the second value. The second value is prevented from being passed to the slave input node in response to the clock node being set to the first value.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
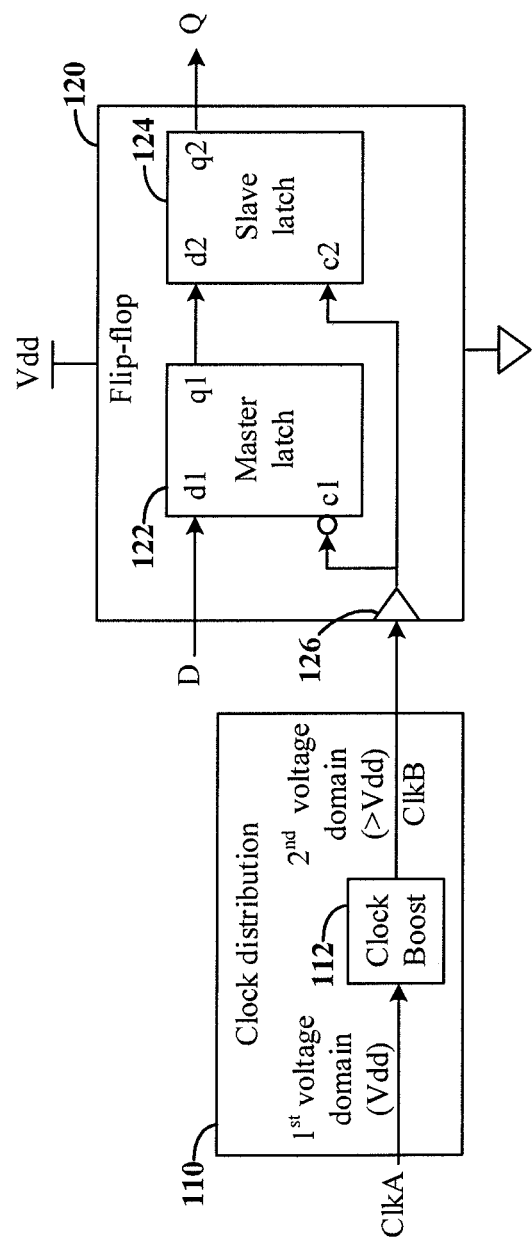
FIG. 1 shows an apparatus, consistent with embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems, and methods involving latch circuits. In certain implementations, aspects of the present disclosure have been shown to be beneficial when used in the context of flip-flop circuits. While not necessarily so limited, various aspects may be appreciated through a discussion of examples using such exemplary contexts.

In some flip-flop circuit arrangements, it can be difficult for a master latch to consistently overwrite a value of a slave latch. For instance, if a data value stored in the slave latch is different than the value of the master latch, there is a significant risk that the master latch will not be able to overpower the slave latch causing an erroneous value to be stored in the slave latch. This contention between the master and the slave latch makes the flip-flop circuit highly susceptible to the process variations Some approaches ensure that the master latch is able to overwrite of the slave latch by implementing the master latch with larger sized transistors than the slave latch. The relative transistor sizing of the master and slave latches improves write-ability of the slave latch by the master latch. Transistor sizing can be an effective way to improve write-ability for flip-flops operating at the higher supply voltage levels. However, at lower supply voltage levels (e.g., <1 V), the impact of transistor sizing on write-ability can be limited. Furthermore, increasing transistor size in the master latch can increase die area requirements and power consumption during operation.

In an example embodiment, the apparatus includes a set of flip-flops configured to operate in a first voltage domain (e.g., between Vdd and Gnd). Each flip-flop includes a master and slave latches responsive to a clock input node of the flip-flop. Each of the master and slave latches includes a respective storage circuit (e.g., a pair of cross-coupled inverters). Each of the latches also includes at least one pass transistor configured to couple/uncouple an input of the latch to/from the storage circuit responsive to the value of the clock input node. It has been recognized that for certain flip-flop circuits the drive strength of the master latch can be increased, relative to the slave latch by a corresponding increase in the voltage of the clock signal. In particular, a boosted clock signal can cause the pass transistor(s) of the master latch to be driven harder. The apparatus can include a clock distribution circuit configured to shift a clock signal from the first voltage domain to a second voltage to produce a second clock signal and provide the second clock signal the clock input node of each flip-flop. The second voltage domain has a voltage extending outside of the first voltage domain. For example, if the first clock signal oscillates between Vdd and Gnd, the second clock signal may exceed Vdd, fall below Gnd, or both. For each reference, the voltage shifted clock signal in the second voltage domain may be referred to as a boosted clock signal. In this arrangement, the flip-flop circuits that exhibit reduced clock-to-output delay and/or reduced power consumption relative to previous approaches.

As explained in more detail with reference to the figures, clocking the flip-flop circuits with a boosted clock signal, having a voltage greater than the voltage in which flip-flops are operated, improves write-ability of the slave latch by the master latch in each flip-flop. In various embodiments, the improved write-ability of the slave latch can decrease the switching clock-to-output delay exhibited by the flip-flop. The clock-to-output delay is the amount of time following a transition of the clock for the output of the flip-flop to be set to the value of the master latch.

The improved write-ability of the slave latch also allows transistor size of the master circuit to be reduced while ensuring that the master latch is able to overwrite the slave latch. For example, in some implementations, the master and slave latches may be implemented with transistors having approximately the same gate dimensions. The use of relatively smaller transistors in the master latch can be useful for reduced die space requirements and power consumption of the flip-flop may also be reduced.

In some implementations, the master pass transistor and the slave pass transistor are driven by a single-phase clock signal. For example, one of the latch circuits may be configured to latch a value when the clock input node of a flip-flop is set to a first value (e.g., logic 0) and the other latch circuit may be configured to latch when the clock input node is set to a second value (e.g., logic 1). This arrangement can eliminate the need for internal clock buffers in the flip-flop, and thereby further reduce power consumption.

Turning now to the figures, FIG. 1 shows an example apparatus, consistent with embodiments of the present disclosure. The apparatus 100 also includes a flip-flop 120 operating in the first voltage domain (Vdd). The flip-flop 120 includes a master latch 122 having an input node d1 coupled to an input D of the flip-flop 120. A slave latch 124 has an input node d2 coupled to the output node q1 of the master latch 122. The slave latch 124 has an output node q2 coupled to the output Q of the flip-flop 120. Clock input node c1 of the master latch 122 and clock input node c2 of the slave latch 124 are both coupled to a clock input node 126 of the flip-flop 120. The master latch 122 is configured to be transparent when clock input node 126 is set to a first value and latch the value of its output node q1 when clock input node 126 is set to a second value. Conversely, the slave latch 124 is configured to be transparent when clock input node 126 is set to the second value and latch the value of output node q1 when clock input node 126 is set to the first value.

The apparatus 100 includes a clock distribution circuit 110 configured to provide a clock signal to the flip-flop 120. The clock distribution circuit includes a clock boost circuit configured to shift a first clock signal ClkA in a first voltage domain (Vdd) to a second voltage domain to produce a second clock signal ClkB. The clock distribution circuit 110 provides the second clock signal ClkB to the clock input node 126 of the flip-flop 120. Clocking of the flip-flop 120 with the second clock signal in the second voltage domain improves write-ability of the slave latch 124 by the master latch 122 in the flip-flop 120. As previously described, the improved write-ability of the slave latch, may decrease power consumption and/or clock-to-output delay exhibited by the flip-flop relative to previous flip-flop circuits.

Figure 2:
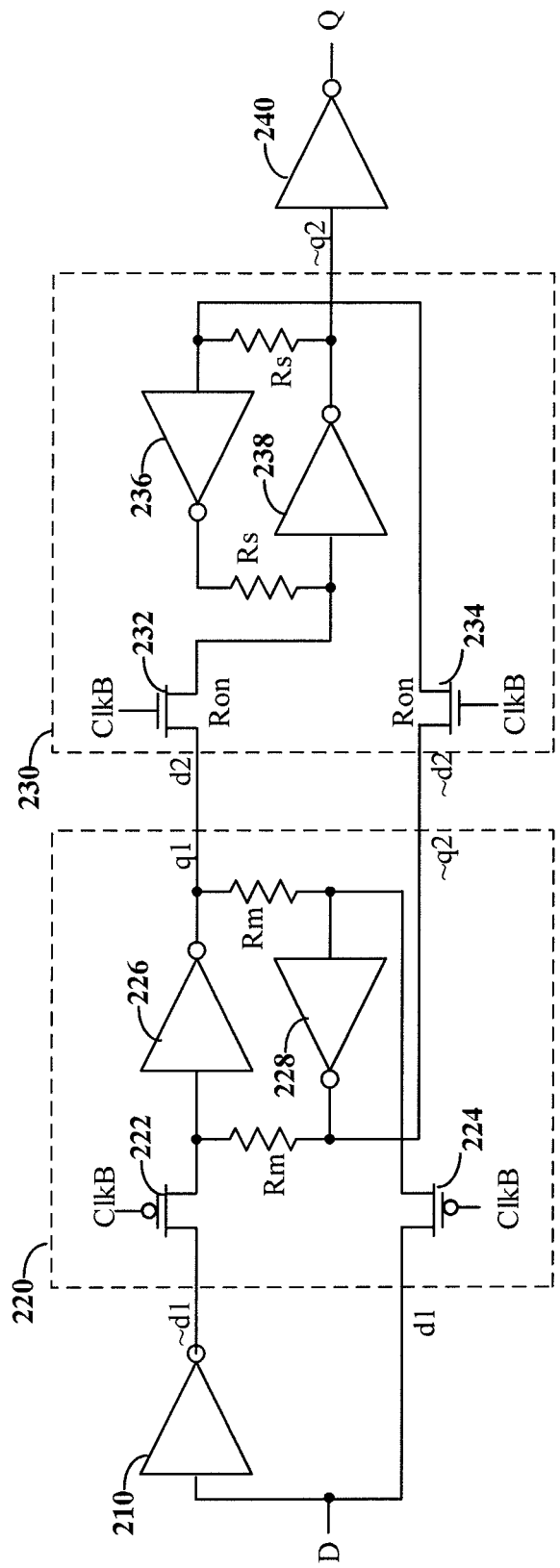
FIG. 2 shows an flip-flop, consistent with embodiments of the present disclosure.

FIG. 2 shows an example flip-flop, consistent with embodiments of the present disclosure. The flip-flop 200 may be used, for example, to implement the flip flop 120 in FIG. 1. The flip-flop 200 includes a master latch 220 having an input node d1 coupled to an input D of the flip-flop 200. The flip-flop 200 also includes an inverter 210 configured to invert the signal at flip-flop input D and provide the inverted signal to an inverted input node ~d1 of the master latch 220. A slave latch 230 has an input d2 coupled to an output q1 of the master latch 220. The slave latch 230 also has an inverted input ~d2 coupled to an inverted output ~q1 of the master latch. In this example, an inverted output ~q2 is coupled to an input of inverter 240. The inverter 240 inverts the signal output from the inverted output ~q2 and provides the result to an output Q of the flip-flop.

In this example, the master latch 220 includes a respective pair of cross-couple inverters 226 and 228. Each of the pair of inverters has an output coupled to an input of the other inverter of the pair. In the master latch, a first inverter 226 inverts a signal input to the input d1 and provides the inverted signal to the input of inverter 228. The inverter 228 inverts the inverted signal and outputs a non-inverted signal to the input of the first inverter 228—thereby maintaining the voltage of the input of the first inverter 226. When an input clock signal ClkB is set to a first value (e.g., logic 0), pass transistors 222 and 224 couple inputs of inverters 226 and 228 to input nodes ~d1 and d1, thereby operating the master latch 220 in a transparent state. In the transparent state, the pass transistors 222 and 224 allow an input data signal D to change the value maintained by the inverters 226 and 228. When the clock signal ClkB is set to a second value (e.g., logic 1), pass transistors 222 and 224 uncouple inputs of inverters 226 and 228 from input nodes ~d1 and d1, thereby operating the master latch 220 in a latched state. In the latched state, the pass transistors 222 and 224 prevent a signal provided to input D from changing the value maintained by the inverters 226 and 228.

The slave latch 230 also includes a pair of cross-couple inverters 236 and 238 and pass transistors 232 and 234 arranged as described with reference to the inverters 226 and 228 and pass transistors 222 and 224 of the master latch. However, the slave latch 230 is operated in the transparent state when the master latch 220 is operated in the latched state. Conversely, the slave latch 230 is operated in the latched state when the master latch 220 is operated in the transparent state. In certain embodiments, the difference in the latched states between the master and slave latches can be accomplished by using pass transistors 232 and 234 that are of the opposite conductivity type (e.g., N-type transistors) from the pass transistors 222 and 224 (e.g., P-type transistors) of the master latch 220.

In various embodiments, the output of each inverters 226, 228, 236, and 238 is coupled to the input of the other inverter of the latch (220 or 230) via a path through an element having resistance (Rm or Rs). The resistance of the elements weakens the ability of each pair of cross coupled inverters to maintain a stored value and, thus, increases write-ability of the latches. For example, if inverters 226 and 236 are equal power, inverter 226 will be able to overpower inverter 236, and set the input of inverter 238 to the value stored by the master latch, if resistance of pass transistor 232 is less than Rs.

The on-resistance of the path provide by the pass transistors 222, 224, 232, and 234 depends on the gate voltage of the clock signal ClkB applied to the gate of the pass transistors. For n-type pass transistors (e.g., 232 and 234 in this example), shifting the clock signal to a voltage above the first voltage domain in which the latches are operated (e.g., above Vdd) reduces the on-resistance of the n-type pass transistors. For p-type pass transistors, (e.g., 222 and 224 in this example), shifting the clock signal to a voltage below first voltage domain (e.g., below Gnd) reduces the on-resistance of the p-type pass transistors. In some implementations the clock ClkB may operate in a voltage domain extending both above and below the voltage domain in which the latches are operated. For example, a first phase of ClkB may be set to voltage above Vdd and a second phase for the ClkB may be set to a voltage below Gnd. As a result, on resistance is reduced for p-type and n-type pass transistors and write-ability of both the master latch 220 and the slave latch 230 is improved.

As previously discussed, flip-flops can be implemented with the master latch 220 using larger transistors than the slave latch 230 to ensure that the master latch 220 is able to overwrite the value stored in the slave latch 230. Due to the improved write-ability of the slave latch 230 provided by clocking the pass transistors 232 and 234 with a clock extending above Vdd, the transistors in the master latch 220 may be reduced in size. For instance, transistors of inverters 226 and 228 in the master latch 220 may be the same size as transistors of inverters 236 and 238 in the slave latch 230. By reducing the size of transistors used to implement the inverters 236 and 238 of the master latch 220, power consumption is reduced relative to previous flip-flop circuits.

Clocking the pass transistors 232 and 234 with a clock extending above Vdd can also improves switching speed of the flip-flop, especially of the transistors of the master latch remain larger. As previously indicated, clocking pass transistors 232 and 234 with a clock having a voltage above Vdd reduces on-resistance of the pass transistors. As a result, the pass transistors are able to pass more current and charge/discharge inputs of inverters 236 and 238 more quickly. Accordingly, the time required for the master latch 220 to overwrite the slave latch 230 following a low-to-high transition of the clock ClkB is reduced.

Figure 3:
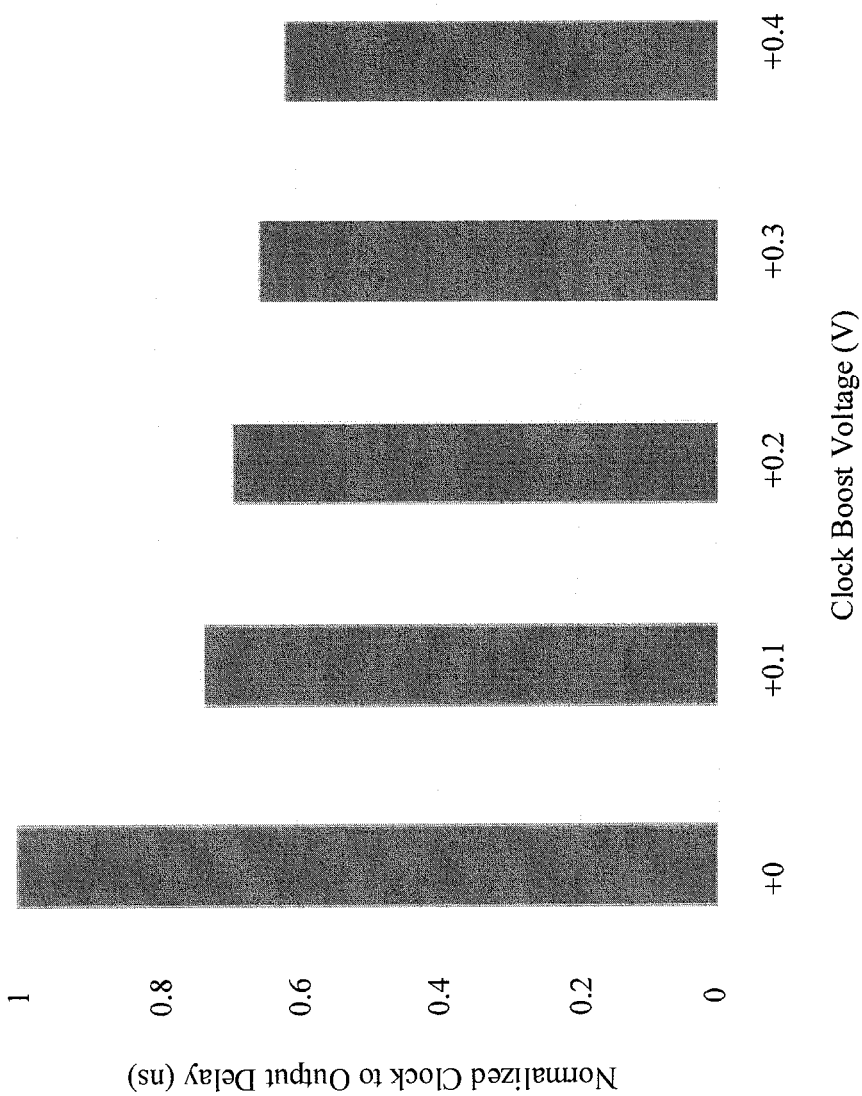
FIG. 3 shows clock to output delay exhibited by an example flip-flop for different voltage shifts of a clock signal.

FIG. 3 shows clock to output delay exhibited by an example flip-flop for different voltage shifts of a clock signal. This example shows clock-to-output delay exhibited by a flip-flop implemented with 40 nm process transistors at 25 degrees Celsius and powered by a Vdd voltage equal to 1.1 V. Without any voltage shifting of the clock, the example flip-flop exhibits a normalized clock-to-output delay of approximately 1 ns. By boosting voltage of the clock signal by 0.1 V above Vdd, clock-to-output delay is reduced to approximately 0.74 V. An additional voltage 0.1 V boost of the clock to 1.2 V reduces the clock-to-output delay to approximately 0.7 V— a 20% improvement relative to delay exhibited without voltage shifting of the clock. Each additional voltage boost of 0.1 V of the clock signal further reduces the clock-to-output delay by approximately 0.04 V.

Figure 4:
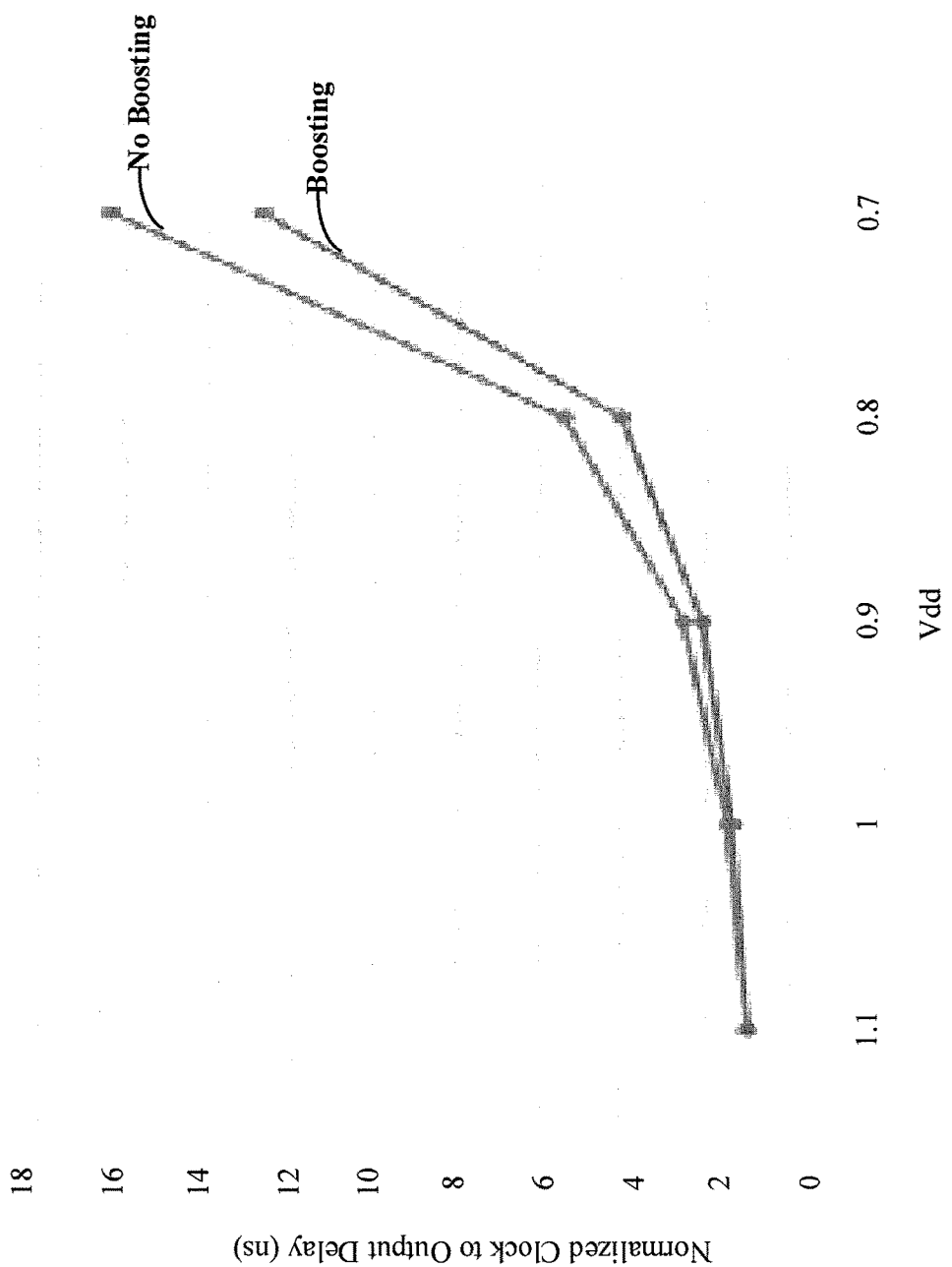
FIG. 4 shows clock to output delay exhibited by an example flip-flop with and without voltage shift of a clock signal for different Vdd voltage levels.

FIG. 4 shows clock to output delay exhibited by an example flip-flop with and without voltage shift of a clock signal for different Vdd voltage levels. In this example, the boosted clock has a voltage of 1.1 V. Non-boosted clock has a voltage equal to Vdd. As Vdd is reduced the difference between the boosted clock voltage and Vdd increases, and the clock-to-output delay is decreased. When Vdd is equal to 0.7V, a boosted clock voltage of 1.1 provides approximately a 22% improvement in clock-to-output delay relative to operation with the clock in the same voltage domain as Vdd.

Figure 5:
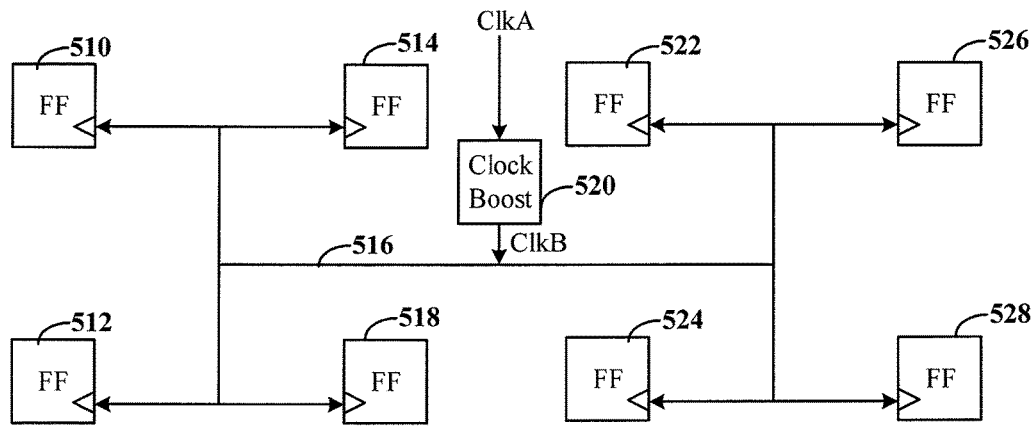
FIG. 5 shows a clock distribution circuit arrangement for clocking a set of flip-flops, consistent with embodiments of the present disclosure.

FIG. 5 shows an example clock distribution circuit arrangement for clocking a set of flip-flops, consistent with embodiments of the present disclosure. The clock distribution circuit includes a clock boost circuit 520 configured to shift a first clock signal ClkA from a first voltage domain to a second voltage domain to produce a second clock signal ClkB as discussed with reference to FIGS. 1 and 2. A distribution network 516 is coupled to distribute the second clock signal to flip-flops 510, 512, 514, 518, 522, 524, 526, and 528. This approach minimizes the circuitry and area required for shifting of the first clock signalHowever, distributing the higher voltage of ClkB increases the dynamic power consumption. Dynamic power consumption is increase as a result of the highly parasitic distrbution network 516 switching with the increased voltage levels.

In another approach, the clock signal ClkA in the first voltage domain may be distributed in close proximity to each flip-flop. For each flip-flop, a respective clock boosting circuit may be provided to shift ClkA to the second voltage domain to produce the second clock ClkB for the flip-flop. However, this approach may require a large amount of area to implement clock boosting circuits, which may consume an excessive amount of power. In some embodiments, power consumption and area of clock boost circuits may be reduced by distributing clock signals using a multi-level clock distribution circuit.

Figure 6:
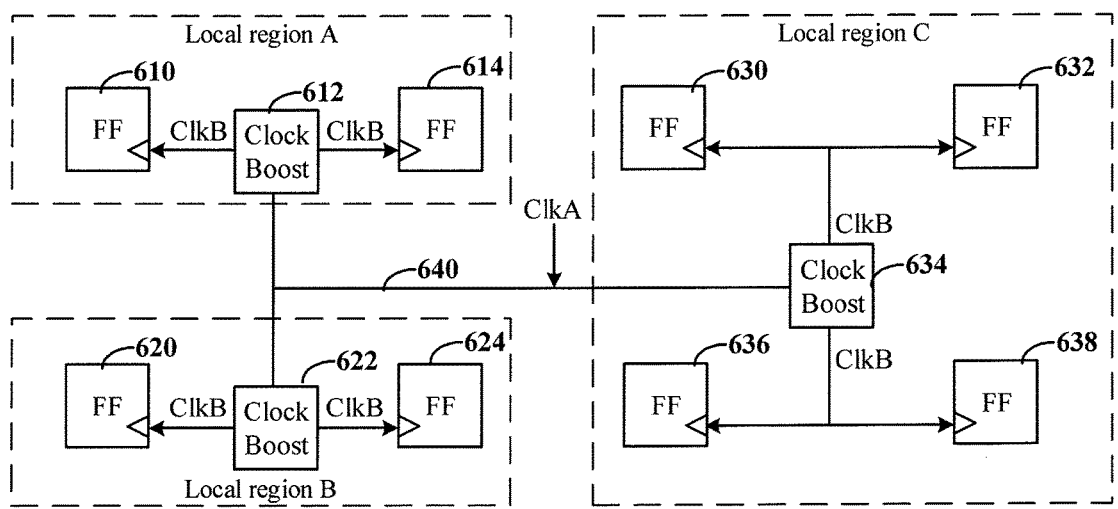
FIG. 6 shows an example multi-level clock distribution circuit arrangement, consistent with embodiments of the present disclosure.

FIG. 6 shows an example multi-level clock distribution circuit arrangement, consistent with embodiments of the present disclosure. In this example, a global distribution network 640 is configured to provide the first clock signal ClkA operating in the first voltage domain to different local regions A, B, and C. Distributing the lower voltage first clock signal to local regions reduces power consumption in the global distribution network 640 as described with reference to FIG. 5. In each local region A, B, and C, a clock boost circuit 612, 622, or 634 is configured to shift the first clock signal from the first voltage domain to the second voltage domain to produce a second clock signal ClkB. The second clock signal is distributed to flip-flops 610, 614, 620, 624, 630, 632, 636, and 638, which are each located in a corresponding local region.

Because a single clock boost circuit (e.g., 634) generates the boosted clock ClkB for multiple flip-flops in each region, power consumption and area of clock boost circuits is reduced relative to implementations that use a single clock boost circuit for each flip-flop. By increasing the number of flip-flops clocked by each clock boost circuit, area and power consumption may be further reduced. Local regions may each include the same number of flip flops of may include different numbers of flip-flops, as shown in FIG. 6. Moreover, in some implementations, some local regions may not include a clock boost circuit and may clock flip-flops or other circuits with the first clock ClkA. The close proximity of flip-flops in each region reduces the parasitic capacitance that is introduced by distribution of ClkB clock signal. Close proximity of flip-flops in each region also reduces the number of buffers that are used to distribute the ClkB clock signal.

In the example shown in FIG. 6, the clock distribution network includes two-levels. In a first level, ClkA is distributed from a source to multiple local regions A, B, and C via network 616. In the second level, ClkB is generated by clock boost circuts and is distributed to multiple flip-flops. In some embodiments, the distribution network may include additional levels. For instance, the ClkB clock signal generated by a clock boost circuit in a local region may be distribed to flip-flops in the local region using a multiple level clock tree network. Additionally, or alternatively, the ClkA clock signal may be distributed to the local regions using a multiple level clock tree network.

Figure 7:
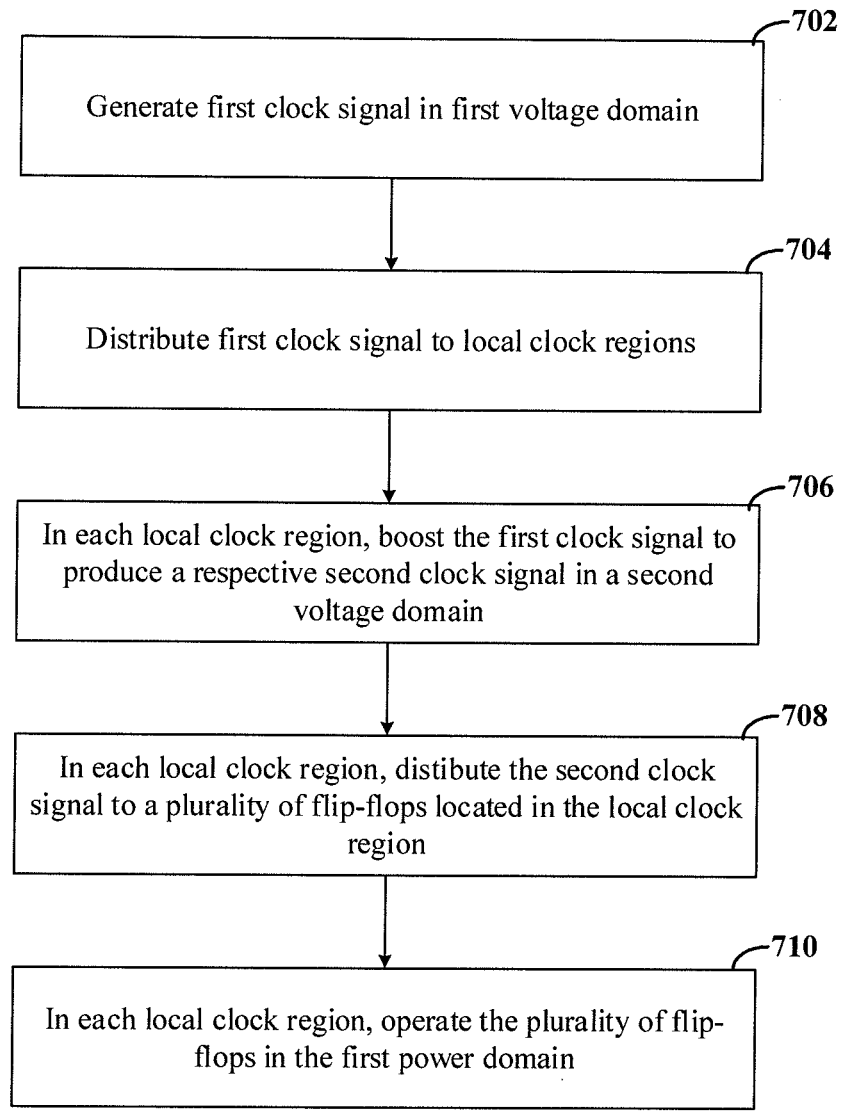
FIG. 7 shows a process for operating a set of flip-flops, consistent with various embodiments of the present disclosure.

FIG. 7 shows a process for operating a set of flip-flops, consistent with various embodiments of the present disclosure. At block 702, a first clock signal is generated in a first voltage domain. At block 704, the first clock signal is distributed to a plurality of local clock regions. In each local clock region, the first clock signal is shifted at block 706 to a second voltage domain to produce a second clock signal. In each local clock region, the generated second clock signal is distributed at block 708 to a plurality of flip-flops located in the local clock region. At block 710, the flip-flops are operated in the first voltage domain and synchronized according to the second clock signal.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., enabling/preventing the oscillation, charging capacitive circuits, or controlling duty-cycled operation of circuits). For example, in certain of the above-discussed embodiments, one or more modules are discrete logic circuits or programmable logic circuits that are configured and arranged for implementing these circuit modules shown in FIGS. 1, 2, 5, and 6 or processes/operations of blocks shown in FIG. 7.

Based upon the above discussion and illustrations, those skilled in the art will readily recognize that various modifications and changes may be made to the various embodiments without strictly following the exemplary embodiments and applications illustrated and described herein. For instance, although aspects and features may in some cases be described in individual figures, it will be appreciated that features from one figure can be combined with features of another figure even though the combination is not explicitly shown or explicitly described as a combination. Such modifications do not depart from the true spirit and scope of various aspects of the invention, including aspects set forth in the claims.

What is claimed is:

1. An apparatus, comprising:
a clock distribution circuit configured to shift a first clock signal operating in a first voltage domain to a second voltage domain to produce a second clock signal, the second voltage domain including a voltage outside of the first voltage domain;
a set of flip-flops operating in the first voltage domain, each flip-flop in the set of flip-flops having a clock node coupled to receive the second clock signal from the clock distribution circuit and including:
a master latch circuit including
a master storage circuit configured and arranged to store a first value from an master input node and provide the stored first value on a master output node, and
a master pass transistor configured to pass the first value from an input of the flip-flop to the master input node in response to the clock node being set to a first value and prevent passing of the first value from the input of the flip-flop to the master input node in response to the clock node being set to a second value; and
a slave latch circuit including
a slave storage circuit configured and arranged to store a second value from a slave input node and provide the stored second value on a slave output node, and
a slave pass transistor configured to pass the second value from the master output node to the slave input node in response to the clock node being set to the second value and prevent passing of the second value from the master output node to the slave input node in response to the clock node being set to the first value.

2. The apparatus of claim 1, wherein
the master and slave storage circuits each include:
a first inverter having a first input and a first output; and a second inverter having a second input coupled to the first output via a first resistive path, and a second output coupled to the first input via a second resistive path.

3. The apparatus of claim 2, wherein:
the on-resistance of the master pass transistor is less than a resistance of the first and second resistive paths in the master latch circuit; and
the on-resistance of the slave pass transistor is less than the resistance of the first and second resistive paths in the slave latch circuit.

4. The apparatus of claim 1, wherein the second voltage domain includes a voltage that exceeds the voltage of the first voltage domain by an amount sufficient to cause the set of flip-flops to exhibit clock-to-output delay that is 30 percent less than a clock-to-output delay exhibited by one of the flip-flops when the first clock signal is provided to the clock node.

5. The apparatus of claim 1, wherein the second voltage domain has a voltage that is lower than the first voltage domain.

6. The apparatus of claim 1, wherein:
the set of flip-flops are located in a plurality of local clock regions; and
the clock distribution circuit includes a distribution network configured to distribute the first clock signal to the plurality of local clock regions and in each local clock region a boost circuit configured to generate the second clock signal and provide the second clock signal to a subset of the flip-flops located in the local clock region.

7. The apparatus of claim 1, wherein:
the set of flip-flops are located in a plurality of local clock regions; and
the clock distribution circuit includes a distribution network configured to distribute the second clock signal to the plurality of local clock regions.

8. The apparatus of claim 1, further comprising, for each of the set of flip-flops, a respective inverter having an input coupled to the slave output node of the flip-flop and an output coupled to an output of the flip-flop.

9. The apparatus of claim 1, wherein the master pass transistor is a p-type transistor and the slave pass transistor is an n-type transistor.

10. The apparatus of claim 1, wherein the master latch circuit includes a first set of transistors and the slave latch circuit includes a second set of transistors having gate dimensions that are the same as the gate dimensions of the first set of transistors.

11. A method, comprising:
using a clock distribution circuit, shifting a first clock signal operating in a first voltage domain to a second voltage domain to produce a second clock signal, wherein the second voltage domain includes a voltage outside of the first voltage domain;
operating a set of flip-flops in the first voltage domain;
providing the second clock signal to respective clock nodes of the set of flip-flops, wherein each of the flip-flops includes a respective master latch circuit, a respective slave latch circuit; and
in each of the set of flip-flops:
passing a first value from an input of the flip-flop to a master input node for the respective master latch circuit in response to the clock node of the flip-flop being set to a first value;
prevent passing of the first value from the input of the flip-flop to the master input node in response to the clock node being set to a second value;
passing the second value from a master output node from the master latch circuit to a slave input node of the slave latch circuit in response to the clock node being set to the second value; and
preventing passing of the second value from the master output node to the slave input node in response to the clock node being set to the first value.

12. The method of claim 11, wherein the second voltage domain includes a voltage that exceeds the voltage of the first voltage domain by an amount sufficient to cause the set of flip-flops to exhibit clock-to-output delay that is 30 percent less than a clock-to-output delay exhibited by one of the flip-flops when the first clock signal is provided to the clock node.

13. The method of claim 11, wherein:
the respective slave latch circuit includes
a first inverter having a first input coupled to the slave input node and a first output;
a second inverter having a second input coupled to the first output via a first resistive path, and a second output coupled to the first input via a second resistive path; and
the passing of the second value from the master output node to the slave input node is performed using a slave pass transistor having an on-resistance that is less than a resistance of the first and second resistive paths in the respective slave latch circuit.

14. The method of claim 13, wherein:
the respective master latch circuit includes
a first inverter having a first input coupled to the master input node and a first output; and
a second inverter having a second input coupled to the first output via a first resistive path, and a second output coupled to the first input via a second resistive path; and
the passing of the first value from the input to the master input node is performed using a master pass transistor having an on-resistance that is less than a resistance of the first and second resistive paths in the respective master latch circuit.

15. The method of claim 14, wherein the master pass transistor is a p-type transistor and the slave pass transistor is an n-type transistor.

16. The method of claim 14, wherein the second voltage domain has a voltage that is lower than the first voltage domain.

17. The method of claim 11, wherein:
the set of flip-flops are located in a plurality of local clock regions; and
the clock distribution circuit includes a distribution network configured to distribute the first clock signal to the plurality of local clock regions and in each local clock region a boost circuit configured to generate the second clock signal and provide the second clock signal to a subset of the flip-flops located in the local clock region.

18. The method of claim 11, wherein:
the set of flip-flops are located in a plurality of local clock regions; and
the providing of the second clock signal to respective clock nodes of the set of flip-flops includes providing the second clock signal to each of the local clock regions via a distribution network.

19. The method of claim 11, wherein:
the set of flip-flops are located in a plurality of local clock regions; and
the providing of the second clock signal to respective clock nodes of the set of flip-flops includes
- providing the first clock signal to each of the local clock regions via a distribution network, and
- in each of the local clock regions, shifting the first clock signal operating in the first voltage domain to the second voltage domain to produce the second clock signal.

20. The method of claim 11, wherein the master latch circuit includes a first set of transistors and the slave latch circuit includes a second set of transistors having gate dimensions that are the same as the gate dimensions of the first set of transistors.

* * * * *